(12) United States Patent
Aoki et al.

(10) Patent No.: US 9,093,307 B2
(45) Date of Patent: Jul. 28, 2015

(54) WAGERING GAME WITH ELEMENTS INFLUENCED BY SYMBOL ARRAY

(71) Applicant: WMS Gaming Inc., Waukegan, IL (US)

(72) Inventors: Dion K. Aoki, Chicago, IL (US); Jeremy M. Hornik, Chicago, IL (US); Jeffry L. Nauman, Yorkville, IL (US); Nicholas Poole, Chicago, IL (US); Allon G. Englman, Chicago, IL (US)

(73) Assignee: WMS Gaming Inc., Waukegan, IL (US)

( * ) Notice: Subject to any disclaimer, the term of this patent is extended or adjusted under 35 U.S.C. 154(b) by 183 days.

(21) Appl. No.: 13/788,764

(22) Filed: Mar. 7, 2013

(65) Prior Publication Data

US 2014/0024429 A1 Jan. 23, 2014

Related U.S. Application Data

(60) Provisional application No. 61/672,803, filed on Jul. 18, 2012.

(51) Int. Cl.

| | |
|---|---|
| *A63F 13/00* | (2014.01) |
| *H01L 21/66* | (2006.01) |
| *H01L 35/00* | (2006.01) |
| *G07F 17/32* | (2006.01) |
| *G06F 1/20* | (2006.01) |

(Continued)

(52) U.S. Cl.
CPC .............. *H01L 22/10* (2013.01); *G06F 1/206* (2013.01); *G06F 1/324* (2013.01); *G06F 1/3253* (2013.01); *G06F 1/3275* (2013.01); *G06F 1/3287* (2013.01); *G07F 17/326* (2013.01); *H01L 22/00* (2013.01); *H01L 23/34* (2013.01); *H01L 25/0657* (2013.01); *H01L 25/18* (2013.01); *H01L 35/00* (2013.01); *H01L 2224/16145* (2013.01); *H01L 2224/16225* (2013.01); *H01L 2225/06513* (2013.01); *H01L 2225/06517* (2013.01); *H01L 2225/06589* (2013.01); *Y02B 60/1217* (2013.01); *Y02B 60/1228* (2013.01); *Y02B 60/1235* (2013.01); *Y02B 60/1282* (2013.01)

(58) Field of Classification Search
CPC .. G07F 17/32; G07F 17/3213; G07F 17/3258; G07F 17/3262; G07F 17/3265; G07F 17/3267
USPC .................................... 463/16, 20, 25, 29, 30
See application file for complete search history.

(56) References Cited

U.S. PATENT DOCUMENTS

| | | | |
|---|---|---|---|
| 6,190,255 B1 | 2/2001 | Thomas et al. | 463/20 |
| 6,347,996 B1 | 2/2002 | Gilmore et al. | 463/17 |

(Continued)

OTHER PUBLICATIONS

Patent Examination Report No. 1 for Australian Application No. 2013202408 dated Aug. 11, 2014 (6 pages).

*Primary Examiner* — James S McClellan
(74) *Attorney, Agent, or Firm* — Nixon Peabody LLP

(57) ABSTRACT

A gaming system includes a memory device storing instructions for receiving a wager and displaying a first array of randomly selected reel symbols at respective first positions. A second array of selectable elements is displayed at respective second positions, each second position being associated with at least one respective first position. In response to the first array of randomly selected reel symbols including a triggering symbol at one of the first positions, the element at the second position associated with the one of the first positions is selected independent of player choice. An award is awarded based on the selected element.

14 Claims, 16 Drawing Sheets

(51) Int. Cl.
   *H01L 23/34*   (2006.01)
   *H01L 25/065*  (2006.01)
   *G06F 1/32*    (2006.01)
   *H01L 25/18*   (2006.01)

(56) References Cited

U.S. PATENT DOCUMENTS

| | | | |
|---|---|---|---|
| 7,175,523 B2 | 2/2007 | Gilmore et al. | 463/16 |
| 7,749,065 B1 | 7/2010 | Englman | 463/17 |
| 8,128,488 B2 | 3/2012 | Gomez et al. | 463/25 |
| 8,137,180 B2 | 3/2012 | Thomas et al. | 463/20 |
| 8,157,634 B2 | 4/2012 | Englman et al. | 463/16 |
| 8,162,740 B2 | 4/2012 | Aoki | 463/20 |
| 8,272,938 B2 | 9/2012 | Gilmore et al. | 463/20 |
| 8,308,545 B2 | 11/2012 | Gomez et al. | 463/16 |
| 8,702,487 B2 | 4/2014 | Thomas | 463/16 |
| 8,702,495 B2 | 4/2014 | Hornik et al. | 463/20 |
| 2005/0215311 A1 | 9/2005 | Hornik et al. | 463/20 |
| 2005/0288093 A1 | 12/2005 | Englman et al. | 463/20 |
| 2006/0068874 A1 | 3/2006 | Hornik et al. | 463/16 |
| 2006/0068893 A1 | 3/2006 | Jaffe et al. | 463/20 |
| 2006/0189378 A1 | 8/2006 | Aoki | 463/20 |
| 2007/0149267 A1 | 6/2007 | Ross et al. | 463/13 |
| 2009/0017906 A1 | 1/2009 | Jackson | 463/26 |
| 2009/0111560 A1 | 4/2009 | Davis et al. | 463/20 |
| 2009/0239631 A1* | 9/2009 | Aoki et al. | 463/20 |
| 2010/0317425 A1* | 12/2010 | Gomez et al. | 463/20 |
| 2012/0021816 A1 | 1/2012 | Aoki | 463/20 |

* cited by examiner

WAGERING GAME WITH ELEMENTS INFLUENCED BY SYMBOL ARRAY

CROSS-REFERENCE TO RELATED APPLICATIONS

This application claims the benefit of and priority to U.S. Provisional Patent Application No. 61/672,803, titled "Wagering Game With Elements Influenced By Symbol Array" and filed on Jul. 18, 2012, which is incorporated herein by reference in its respective entirety.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates generally to gaming apparatus and methods and, more particularly, to elements influenced by a symbol array for a wagering game.

BACKGROUND OF THE INVENTION

Gaming terminals, such as slot machines, video poker machines and the like, have been a cornerstone of the gaming industry for several years. Generally, the popularity of such machines with players is dependent on the likelihood (or perceived likelihood) of winning money at the machine and the intrinsic entertainment value of the machine relative to other available gaming options. Where the available gaming options include a number of competing machines and the expectation of winning at each machine is roughly the same (or believed to be the same), players are likely to be attracted to the most entertaining and exciting machines. Shrewd operators consequently strive to employ the most entertaining and exciting machines, features, and enhancements available because such machines attract frequent play and hence increase profitability to the operator. Therefore, there is a continuing need for gaming machine manufacturers to continuously develop new games and improved gaming enhancements that will attract frequent play through enhanced entertainment value to the player.

Traditionally, gaming machines operate under control of a processor that has been programmed to execute base games and bonus games in which reel arrays spin and stop to display symbol combinations in a display area. If winning combinations are achieved by the symbol combinations, awards are provided to the players.

SUMMARY OF THE INVENTION

According to one aspect of the present invention, a gaming system includes one or more input devices, one or more display devices, and one or more processors. The gaming system further includes at least one memory device storing instructions that, when executed by the one or more processors, cause the gaming system to receive an input, via the one or more input devices, indicative of a wager and to display on the one or more display devices a first array of randomly selected reel symbols at respective first positions. A second array of selectable elements is displayed on the one or more display devices at respective second positions, each second position being associated with at least one respective first position. In response to the first array of randomly selected reel symbols including a triggering symbol at one of the first positions, the element at the second position associated with the one of the first positions is selected independent of player choice. An award is awarded based on the selected element.

According to another aspect of the invention, a gaming system includes one or more input devices, one or more display devices, and one or more processors. The gaming system further includes at least one memory device storing instructions that, when executed by the one or more processors, cause the gaming system to receive an input, via the one or more input devices, indicative of a wager and to display on the one or more display devices an array of positions bearing respective randomly selected reel symbols. An array of selectable elements is displayed on the one or more display devices, each element being associated with at least one respective position in the array of positions. In response to the randomly selected reel symbols including a triggering symbol, the element associated with the position of the triggering symbol is selected independent of player choice. An award is awarded based on the selected element.

According to yet another aspect of the invention, a computer-implemented method in a gaming system includes receiving a wager in response to an input via at least one input device, and displaying on at least one display device a first array of randomly selected reel symbols at respective first positions. A second array of selectable elements is displayed on the at least one display device at respective second positions, each second position being associated with at least one respective first position. In response to the first array of randomly selected reel symbols including a triggering symbol at one of the first positions, the element at the second position associated with the one of the first positions, is selected independent of player choice by one or more processors. An award is awarded, by at least one of the one or more processors, based on the selected element.

According to yet another aspect of the invention, one or more machine-readable non-transitory storage media include instructions which, when executed by one or more processors, cause the one or more processors to perform one or more operations. The one or more operations include receiving a wager in response to an input via at least one input device, and displaying on at least one display device a first array of randomly selected reel symbols at respective first positions. The one or more operations further include displaying on the at least one display device a second array of selectable elements at respective second positions, each second position being associated with at least one respective first position. In response to the first array of randomly selected reel symbols including a triggering symbol at one of the first positions, the element at the second position associated with the one of the first positions is selected independent of player choice. An award is awarded based on the selected element.

Additional aspects of the invention will be apparent to those of ordinary skill in the art in view of the detailed description of various embodiments, which is made with reference to the drawings, a brief description of which is provided below.

Figure 1:
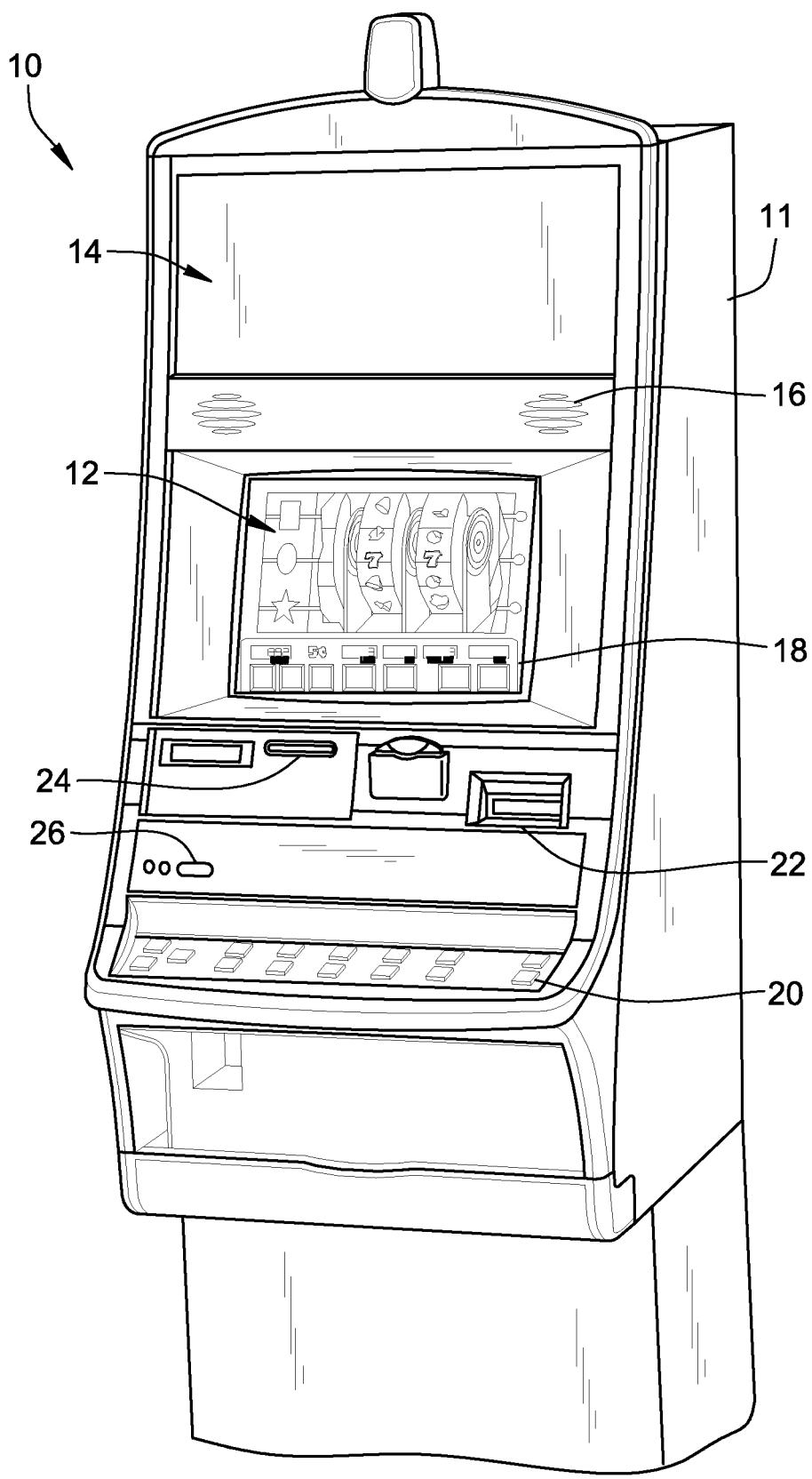
FIG. 1 is a perspective view of a free-standing gaming terminal according to an embodiment of the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated. For purposes of the present detailed description, the singular includes the plural and vice versa (unless specifically disclaimed); the words "and" and "or" shall be both conjunctive and disjunctive; the word "all" means "any and all"; the word "any" means "any and all"; and the word "including" means "including without limitation."

Referring to FIG. 1, there is shown a gaming terminal 10 similar to those used in gaming establishments, such as casinos. With regard to the present invention, the gaming terminal 10 may be any type of gaming terminal and may have varying structures and methods of operation. For example, in some aspects, the gaming terminal 10 is an electromechanical gaming terminal configured to play mechanical slots, whereas in other aspects, the gaming terminal is an electronic gaming terminal configured to play a video casino game, such as slots, keno, poker, blackjack, roulette, craps, etc. The gaming terminal 10 may take any suitable form, such as floor-standing models as shown, handheld mobile units, bartop models, workstation-type console models, etc. Further, the gaming terminal 10 may be primarily dedicated for use in conducting wagering games, or may include non-dedicated devices, such as mobile phones, personal digital assistants, personal computers, etc. Exemplary types of gaming terminals are disclosed in U.S. Pat. No. 6,517,433 and Patent Application Publication Nos. US2010/0069160 and US2010/0234099, which are incorporated herein by reference in their entireties.

The gaming terminal 10 illustrated in FIG. 1 comprises a cabinet 11 that may house various input devices, output devices, and input/output devices. By way of example, the gaming terminal 10 includes a primary display area 12, a secondary display area 14, and one or more audio speakers 16. The primary display area 12 or the secondary display area 14 may be a mechanical-reel display, a video display, or a combination thereof in which a transmissive video display is disposed in front of the mechanical-reel display to portray a video image superimposed upon the mechanical-reel display. The display areas may variously display information associated with wagering games, non-wagering games, community games, progressives, advertisements, services, premium entertainment, text messaging, emails, alerts, announcements, broadcast information, subscription information, etc. appropriate to the particular mode(s) of operation of the gaming terminal 10. The gaming terminal 10 includes a touch screen(s) 18 mounted over the primary or secondary areas, buttons 20 on a button panel, bill validator 22, information reader/writer(s) 24, and player-accessible port(s) 26 (e.g., audio output jack for headphones, video headset jack, USB port, wireless transmitter/receiver, etc.). It should be understood that numerous other peripheral devices and other elements exist and are readily utilizable in any number of combinations to create various forms of a gaming terminal in accord with the present concepts.

Input devices, such as the touch screen 18, buttons 20, a mouse, a joystick, a gesture-sensing device, a voice-recognition device, and a virtual input device, accept player input(s) and transform the player input(s) to electronic data signals indicative of the player input(s), which correspond to an enabled feature for such input(s) at a time of activation (e.g., pressing a "Max Bet" button or soft key to indicate a player's desire to place a maximum wager to play the wagering game). The input(s), once transformed into electronic data signals, are output to a CPU for processing. The electronic data signals are selected from a group consisting essentially of an electrical current, an electrical voltage, an electrical charge, an optical signal, an optical element, a magnetic signal, and a magnetic element.

Figure 2:
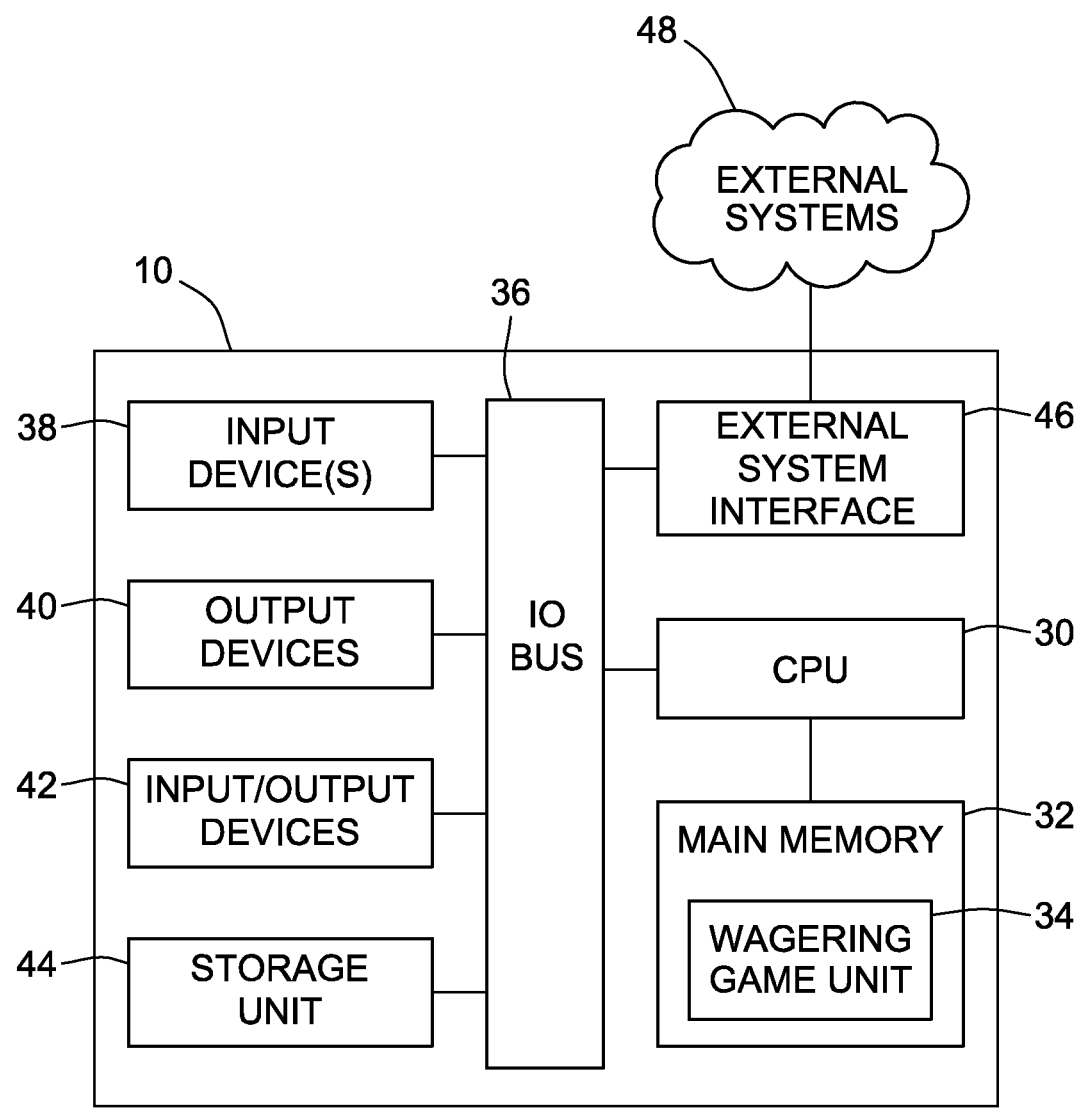
FIG. 2 is a schematic view of a gaming system according to an embodiment of the present invention.

Turning now to FIG. 2, there is shown a block diagram of the gaming-terminal architecture. The gaming terminal 10 includes a central processing unit (CPU) 30 connected to a main memory 32. The CPU 30 may include any suitable processor(s), such as those made by Intel and AMD. By way of example, the CPU 30 includes a plurality of microprocessors including a master processor, a slave processor, and a secondary or parallel processor. CPU 30, as used herein, comprises any combination of hardware, software, or firmware disposed in or outside of the gaming terminal 10 that is configured to communicate with or control the transfer of data between the gaming terminal 10 and a bus, another computer, processor, device, service, or network. The CPU 30 comprises one or more controllers or processors and such one or more controllers or processors need not be disposed proximal to one another and may be located in different devices or in different locations. The CPU 30 is operable to execute all of the various gaming methods and other processes disclosed herein. The main memory 32 includes a wagering game unit 34. In one embodiment, the wagering game unit 34 may present wagering games, such as video poker, video black jack, video slots, video lottery, etc., in whole or part.

The CPU 30 is also connected to an input/output (I/O) bus 36, which can include any suitable bus technologies, such as an AGTL+ frontside bus and a PCI backside bus. The I/O bus 36 is connected to various input devices 38, output devices 40, and input/output devices 42 such as those discussed above in connection with FIG. 1. The I/O bus 36 is also connected to storage unit 44 and external system interface 46, which is connected to external system(s) 48 (e.g., wagering game networks).

The external system 48 includes, in various aspects, a gaming network, other gaming terminals, a gaming server, a remote controller, communications hardware, or a variety of other interfaced systems or components, in any combination. In yet other aspects, the external system 48 may comprise a player's portable electronic device (e.g., cellular phone, electronic wallet, etc.) and the external system interface 46 is configured to facilitate wireless communication and data transfer between the portable electronic device and the CPU 30, such as by a near-field communication path operating via magnetic-field induction or a frequency-hopping spread spectrum RF signals (e.g., Bluetooth, etc.).

The gaming terminal 10 optionally communicates with the external system 48 such that the terminal operates as a thin, thick, or intermediate client. In general, a wagering game includes an RNG for generating a random number, game logic for determining the outcome based on the randomly generated number, and game assets (e.g., art, sound, etc.) for presenting the determined outcome to a player in an audiovisual manner. The RNG, game logic, and game assets are contained within the gaming terminal 10 ("thick client" gaming terminal), the external system 48 ("thin client" gaming terminal), or are distributed therebetween in any suitable manner ("intermediate client" gaming terminal).

The gaming terminal 10 may include additional peripheral devices or more than one of each component shown in FIG. 2. Any component of the gaming terminal architecture may include hardware, firmware, or tangible machine-readable storage media including instructions for performing the operations described herein. Machine-readable storage media includes any mechanism that stores information and provides the information in a form readable by a machine (e.g., gaming terminal, computer, etc.). For example, machine-readable storage media includes read only memory (ROM), random access memory (RAM), magnetic disk storage media, optical storage media, flash memory, etc.

Figure 3:
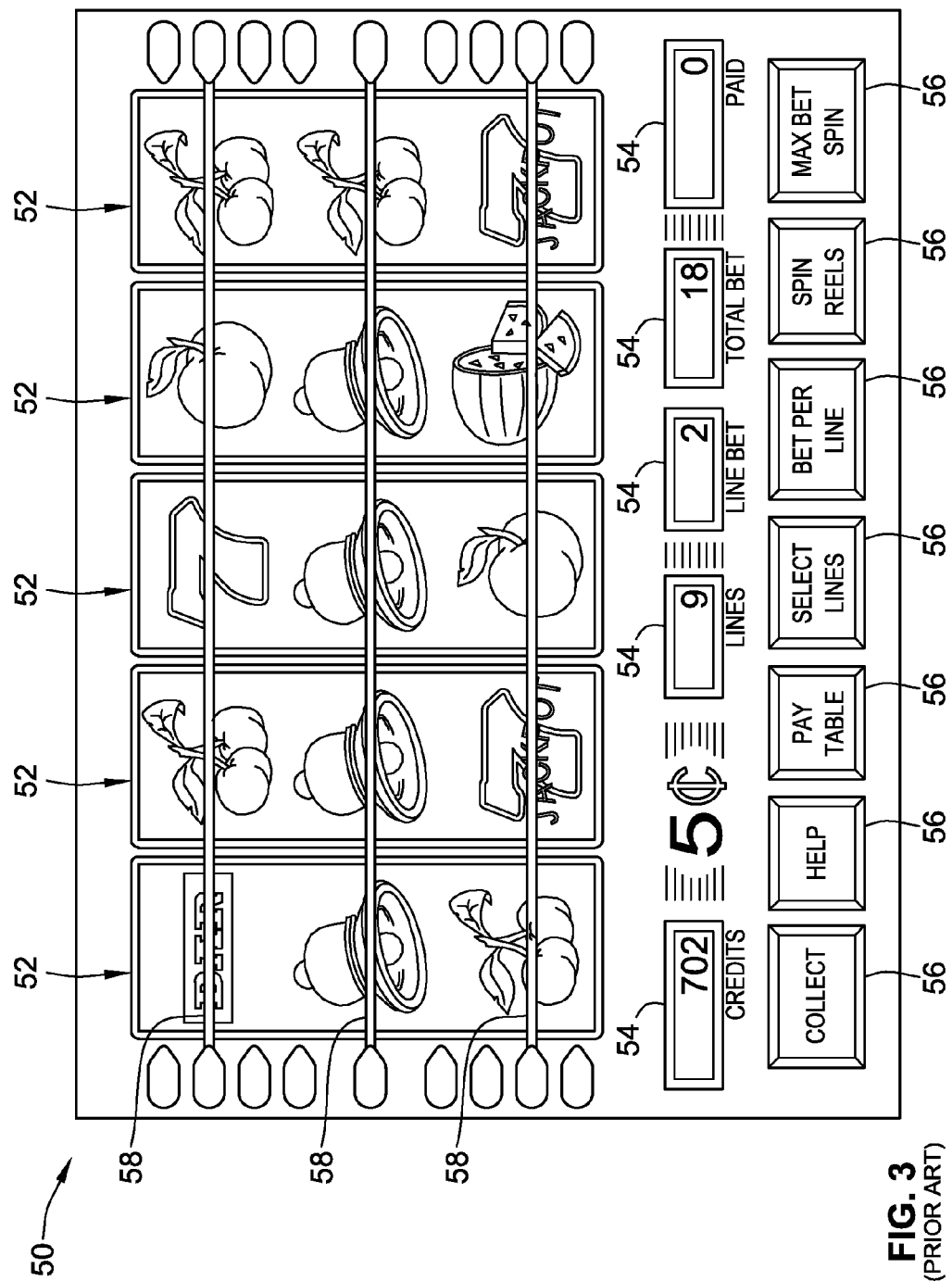
FIG. 3 is an image of an exemplary basic-game screen of a wagering game displayed on a gaming terminal, according to an embodiment of the present invention.

Referring now to FIG. 3, there is illustrated an image of a basic-game screen 50 adapted to be displayed on the primary display area 12 or the secondary display area 14. The basic-game screen 50 portrays a plurality of simulated symbol-bearing reels 52. Alternatively or additionally, the basic-game screen 50 portrays a plurality of mechanical reels or other video or mechanical presentation consistent with the game format and theme. The basic-game screen 50 also advantageously displays one or more game-session credit meters 54 and various touch screen buttons 56 adapted to be actuated by a player. A player can operate or interact with the wagering game using these touch screen buttons or other input devices such as the buttons 20 shown in FIG. 1. The CPU operate(s) to execute a wagering game program causing the primary display area 12 or the secondary display area 14 to display the wagering game.

In response to receiving a wager, the reels 52 are rotated and stopped to place symbols on the reels in visual association with paylines such as paylines 58. The wagering game evaluates the displayed array of symbols on the stopped reels and provides immediate awards and bonus features in accordance with a pay table. The pay table may, for example, include "line pays" or "scatter pays." Line pays occur when a predetermined type and number of symbols appear along an activated payline, typically in a particular order such as left to right, right to left, top to bottom, bottom to top, etc. Scatter pays occur when a predetermined type and number of symbols appear anywhere in the displayed array without regard to position or paylines. Similarly, the wagering game may trigger bonus features based on one or more bonus triggering symbols appearing along an activated payline (i.e., "line trigger") or anywhere in the displayed array (i.e., "scatter trigger"). The wagering game may also provide mystery awards and features independent of the symbols appearing in the displayed array.

In accord with various methods of conducting a wagering game on a gaming system in accord with the present concepts, the wagering game includes a game sequence in which a player makes a wager and a wagering game outcome is provided or displayed in response to the wager being received or detected. The wagering game outcome is then revealed to the player in due course following initiation of the wagering game. The method comprises the acts of conducting the wagering game using a gaming apparatus, such as the gaming terminal 10 depicted in FIG. 1, following receipt of an input from the player to initiate the wagering game. The gaming terminal 10 then communicates the wagering game outcome to the player via one or more output devices (e.g., primary display 12 or secondary display 14) through the display of information such as, but not limited to, text, graphics, static images, moving images, etc., or any combination thereof. In accord with the method of conducting the wagering game, the CPU transforms a physical player input, such as a player's pressing of a "Spin Reels" touch key, into an electronic data signal indicative of an instruction relating to the wagering game (e.g., an electronic data signal bearing data on a wager amount).

In the aforementioned method, for each data signal, the CPU (e.g., CPU 30) is configured to process the electronic data signal, to interpret the data signal (e.g., data signals corresponding to a wager input), and to cause further actions associated with the interpretation of the signal in accord with computer instructions relating to such further actions executed by the controller. As one example, the CPU causes the recording of a digital representation of the wager in one or more storage media (e.g., storage unit 44), the CPU, in accord with associated computer instructions, causing the changing of a state of the storage media from a first state to a second state. This change in state is, for example, effected by changing a magnetization pattern on a magnetically coated surface of a magnetic storage media or changing a magnetic state of a ferromagnetic surface of a magneto-optical disc storage media, a change in state of transistors or capacitors in a volatile or a non-volatile semiconductor memory (e.g., DRAM), etc. The noted second state of the data storage media comprises storage in the storage media of data representing the electronic data signal from the CPU (e.g., the wager in the present example). As another example, the CPU further, in accord with the execution of the instructions relating to the wagering game, causes the primary display 12, other display device, or other output device (e.g., speakers, lights, communication device, etc.) to change from a first state to at least a second state, wherein the second state of the primary display comprises a visual representation of the physical player input (e.g., an acknowledgement to a player), information relating to the physical player input (e.g., an indication of the wager amount), a game sequence, an outcome of the game sequence, or any combination thereof, wherein the game sequence in accord with the present concepts comprises acts described herein. The aforementioned executing of computer instructions relating to the wagering game is further conducted in accord with a random outcome (e.g., determined by a RNG) that is used by the CPU to determine the outcome of the game sequence, using a game logic for determining the outcome based on the randomly generated number. In at least some aspects, the CPU is configured to determine an outcome of the game sequence at least partially in response to the random parameter.

Figure 4:
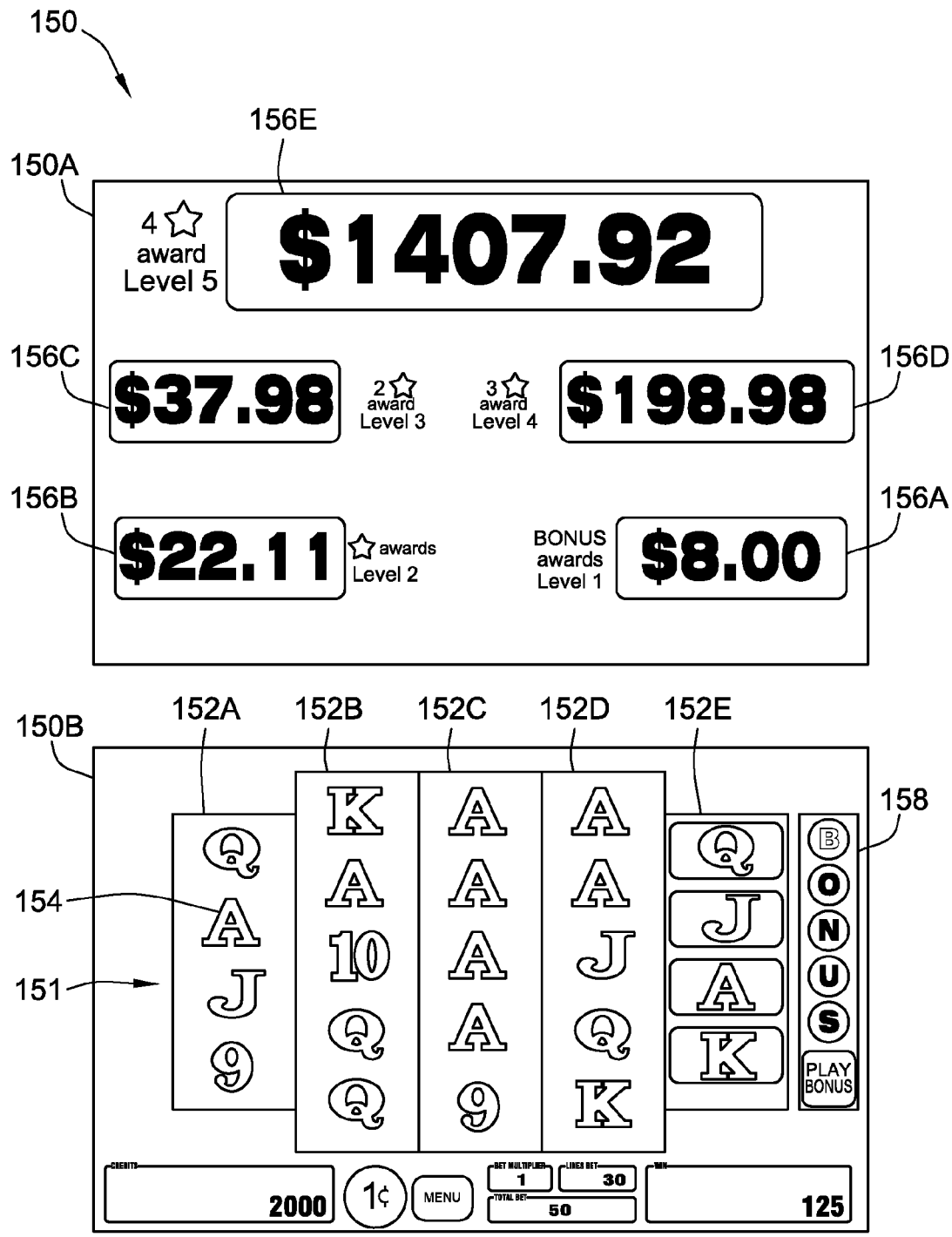
FIG. 4 is an image displaying a basic-game screen in which a bonus event has been achieved.

Referring now to FIG. 4, an image of a game screen 150 is adapted to be displayed on the primary display area 12 or the secondary display area 14. The game screen 150 includes an upper image 150A for displaying progressive award information and a lower image 150B for displaying a first array 151 in the form of symbol-bearing reels 152A-152E having a plurality of reel symbols 154.

The progressive award information in the upper image 150A includes indicia for five different levels of progressive awards, which include a level one progressive award 156A of $8.00, a level two progressive award 156B of $22.11, a level three progressive award 156C of $37.98, a level four progressive award 156D of $198.98, and a level five progressive award 156E of $1,407.92. Each of the five levels of progressive awards is awarded based on a respective game outcome. Specifically, in this example, the first level 156A is awarded if a bonus game is achieved, the second level 156B is awarded if a star symbol is achieved, the third level 156C is awarded if two star symbols are achieved, the fourth level 156D is awarded if three star symbols are achieved, and the fifth level 156E is awarded if four star symbols are achieved.

In the lower image 150B, the symbols 154 are displayed at respective positions in the first array 151. For example, a Q symbol is displayed in a top position of a leftmost reel 152A, a K symbol is displayed in a top position of a second reel 152B, etc. The lower image 150B further displays a plurality of bonus positions 158 on the rightmost reel 152E. According to one example, one letter of the bonus positions 158 is awarded for each credit wagered per line. As a further example, players may initiate a bonus event with any number of letters of the bonus positions 158, but may be required to have all the letters of the bonus positions 158 to be eligible for the progressive awards (e.g., spell out "BONUS").

Figure 5:
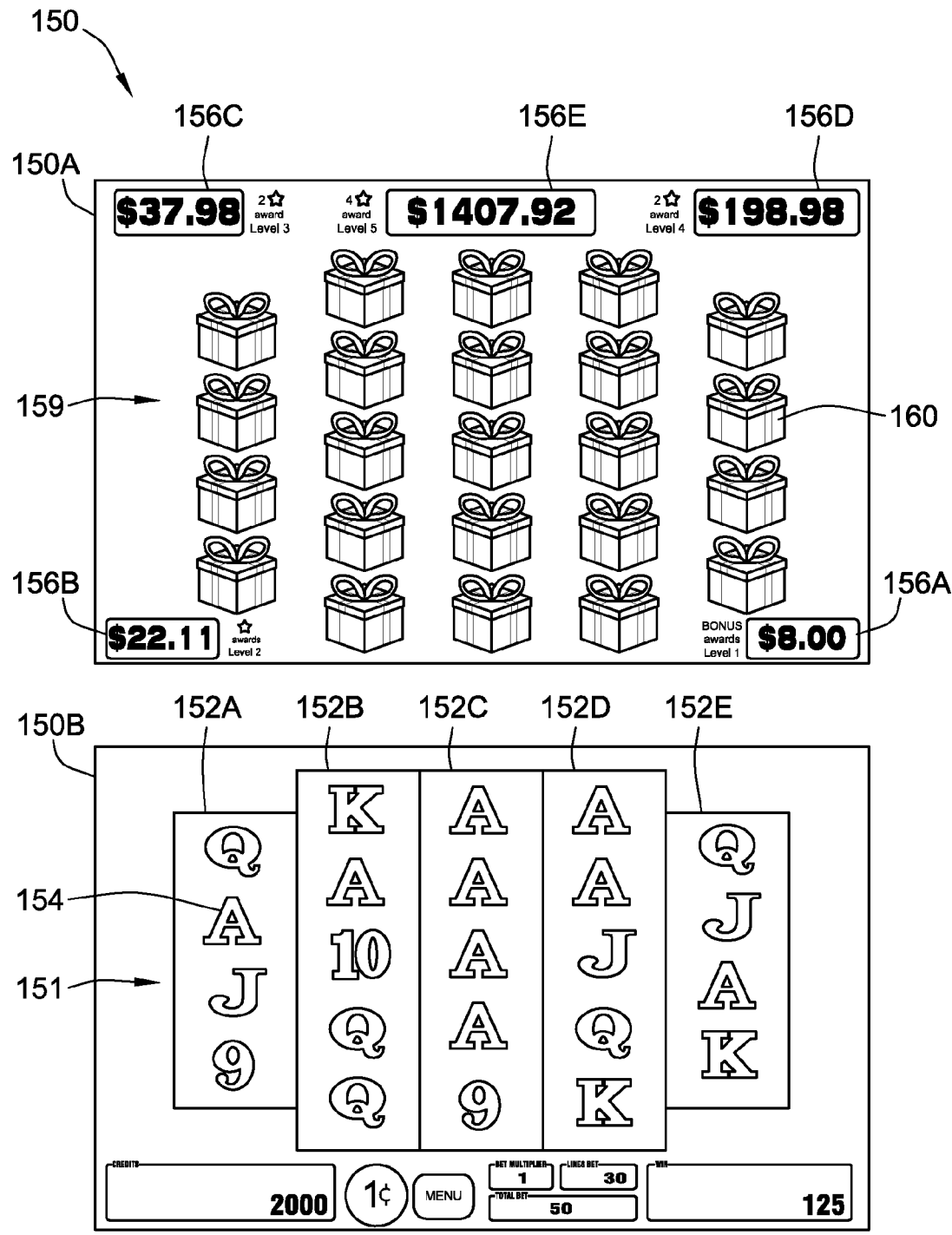
FIG. 5 is an image of the bonus event prior to playing a plurality of free spins, the bonus event including two adjacent arrays.

Referring to FIG. 5, a bonus event has been awarded to the player. For example, the bonus event includes a plurality of eight free spins, with each randomly selected outcome of the free spins being portrayed in the lower image 150B. The bonus event may occur in response to a bonus trigger occurring in the first array 151, e.g., having the player spell out "BONUS" in the bonus positions 158 of FIG. 4. Currently, none of the free spins has been played. During the bonus event, a second array 159 of selectable elements 160 (illustrated in the form of gift symbols) is presented in the upper image 150A, in an adjacent position relative to the first array 151. The selectable elements 160 are randomly selected, independent of player choice. The progressive awards 156A-156E are illustrated around the edges of the upper image 150B.

According to the illustrated example, the second array 159 has the same number and arrangement of positions as the first array 151. For example, both the first array 151 and the second array 159 have five columns, the first and the fifth columns having four rows and the second, third, and fourth columns having five rows. Alternatively, the first and second arrays 151, 159 can have a different number and arrangement of positions than each other.

Figure 6:
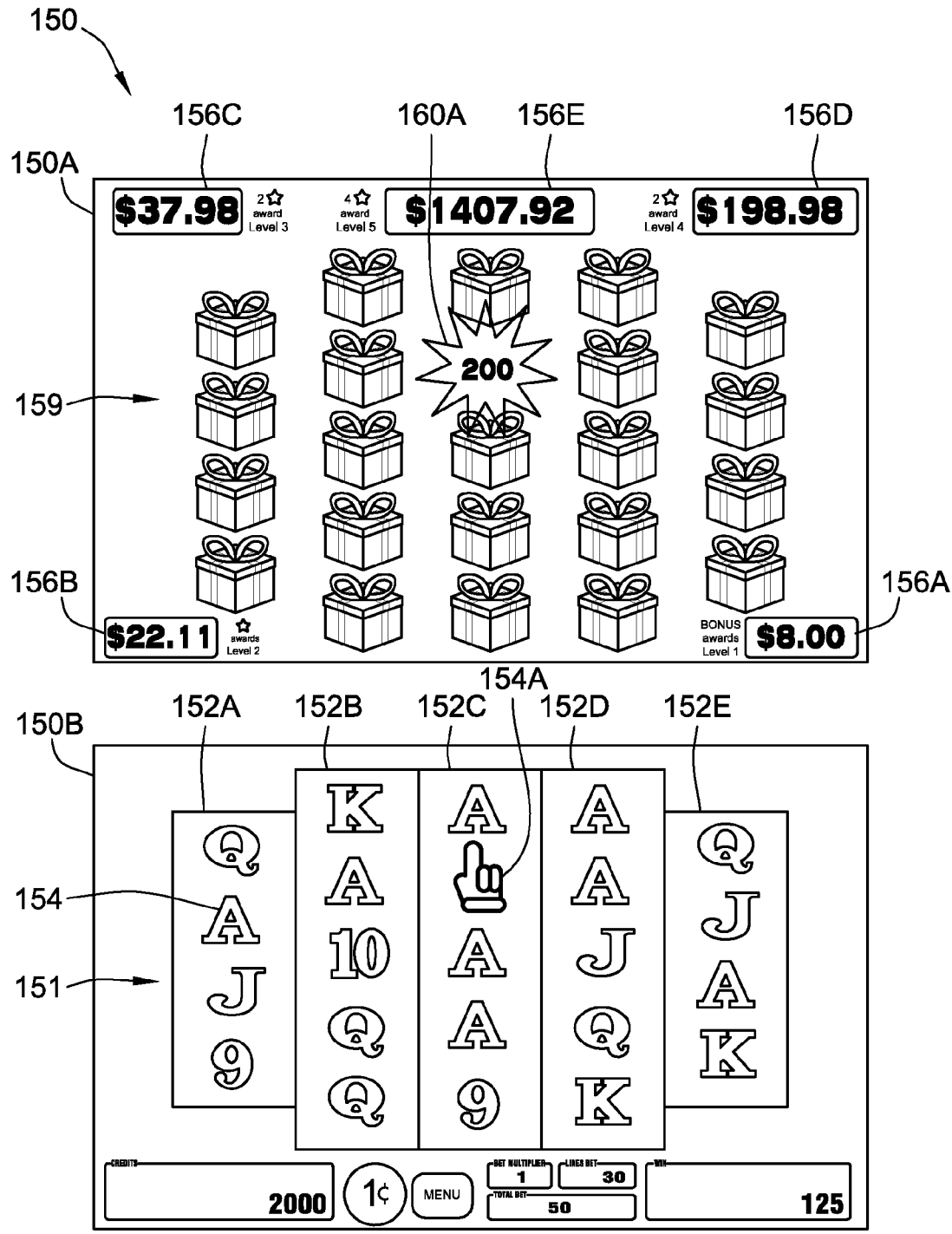
FIG. 6 is an image of an outcome in which a triggering symbol causes the selection of an associated selectable element.

Referring to FIG. 6, a first one of the free spins has been played and the illustrated randomly selected outcome has been achieved in the symbol-bearing reels 152A-152E. One of the symbols in the first array 151, illustrated in the form of a hand symbol, is a triggering symbol 154A. The triggering symbol 154A results in selecting, independent of player choice, an associated element 160A in the second array 159. The selection of the associated element 160A reveals an award of 200 credits.

Alternatively, the selection of the associated element 160A can reveal other types of awards, including, for example, additional free spins, multipliers, etc. In another example, the player can earn special favor symbols that affect a game outcome. For example, the player can receive a game-continuation symbol that overrides a game-termination symbol.

According to this example, the position of the associated element 160A is a counterpart position of the position of the triggering symbol 154A. Specifically, the position of the associated element 160A is in the second row, third column, of the second array 159. Similarly, the position of the triggering symbol 154A is in the second row, third column, of the first array 151. Alternatively, the positions of the triggering symbol 154A and the associated element 160A are not counterpart positions. For example, the position of the triggering symbol 154A may be located in the first row, first column, of the first array 151, but the position of the associated element 150A may be located in the second row, second column, of the second array 159.

Figure 7:
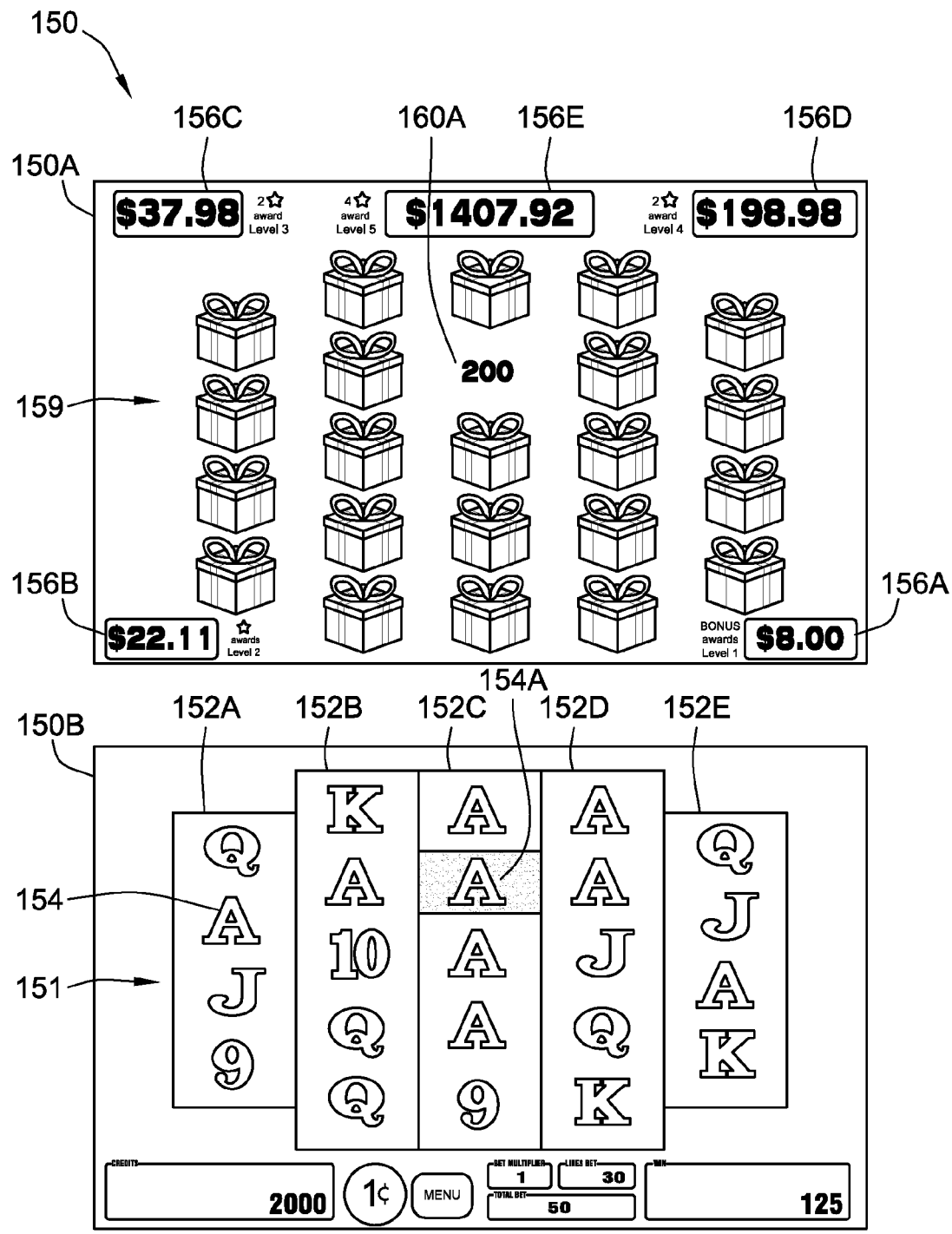
FIG. 7 is an image of the outcome of FIG. 6 after a revealed award has been awarded.

Referring to FIG. 7, after the award is awarded, the array positions of the triggering symbol 154A and the associated element 160A are now marked for indicating the award during remaining ones of the free spins. For example, the position of the triggering symbol 154A is darkened or highlighted to indicate the triggering position to the player. The position of the associated element 160A is de-emphasized to only show the award value of 200 credits, without the additional "splash" indicia. Optionally, the position of the associated element 160A is not awarded again for the remaining ones of the free spins.

Optionally, after an associated element is awarded, additional options can be provided to the player if the same array position is selected again. For example, if the same array position of the triggering symbol 154A is selected again, i.e., second row, third column of the first array 151, the additional options can include one or more of the following options: (a) randomly award prizes above, below, to the right, or to the left of the array position of the associated element 160A (i.e., second row, third column of the second array 159); (b) randomly award any of the other prizes of the second array 159; (c) award an award in another array with potentially higher prizes; (d) end the bonus event (e.g., reveal a game terminating symbol such as a pooper symbol); and (e) award a higher award every time the same array position is selected.

Figure 8:
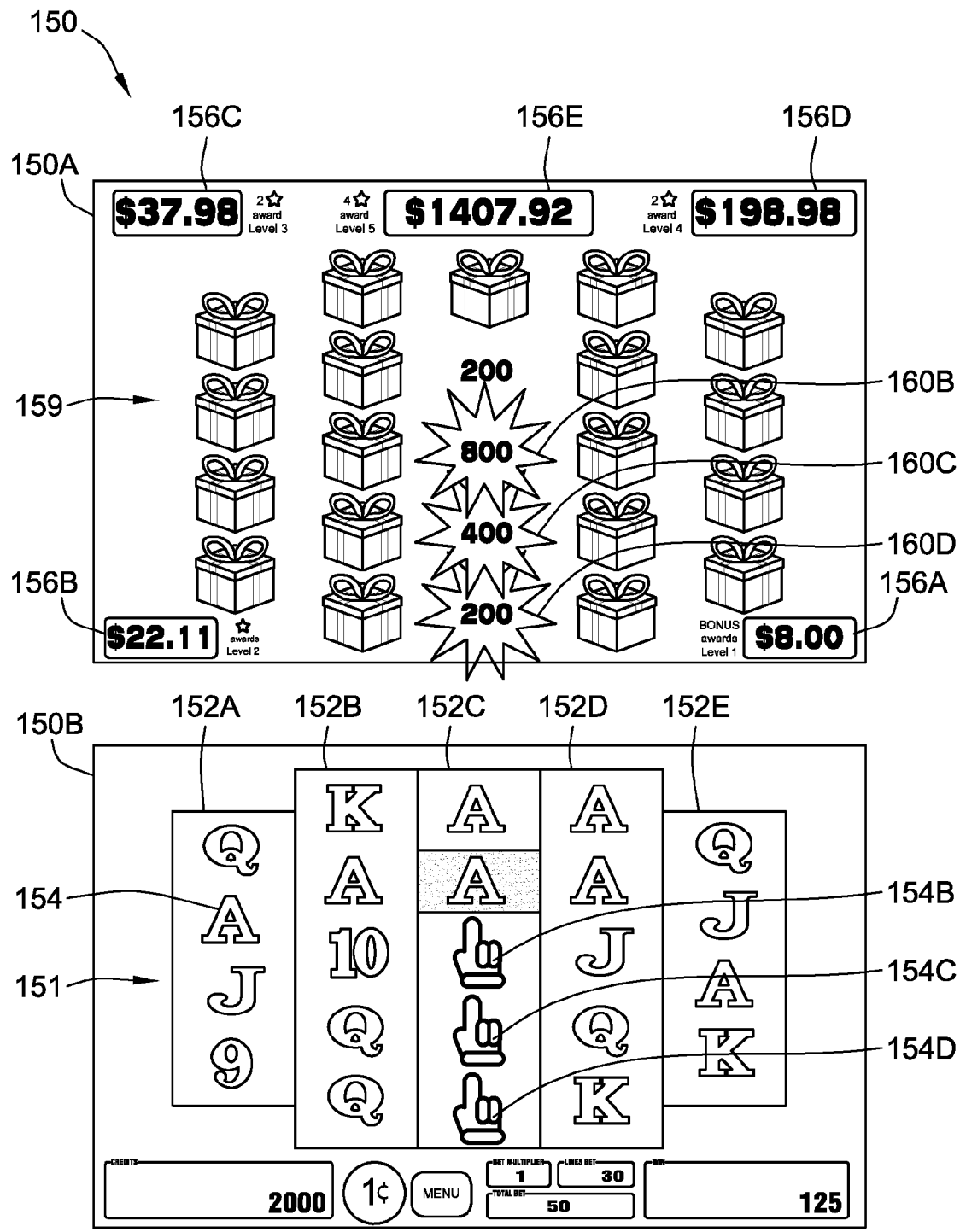
FIG. 8 is an image of an outcome in which a clump of triggering symbols cause the selection of associated ones of selectable elements.

Referring to FIG. 8, the triggering symbol can appear as a clump of triggering symbols 154B-154D. For example, a second one of the free spins has been played and the illustrated randomly selected outcome displays three triggering symbols 154B-154D in the third, fourth, and fifth rows of the third column of the first array 151. In response to the first array 151 including the triggering symbols 154B-154D, three associated elements 160B-160D in the second array 159 are automatically selected. The associated elements 160B-160D of the second array 159 are in counterpart positions of the first array 151. The awards of 200 credits, 400 credits, and 800 credits are revealed based on the selected elements 160B-160D.

Figure 9:
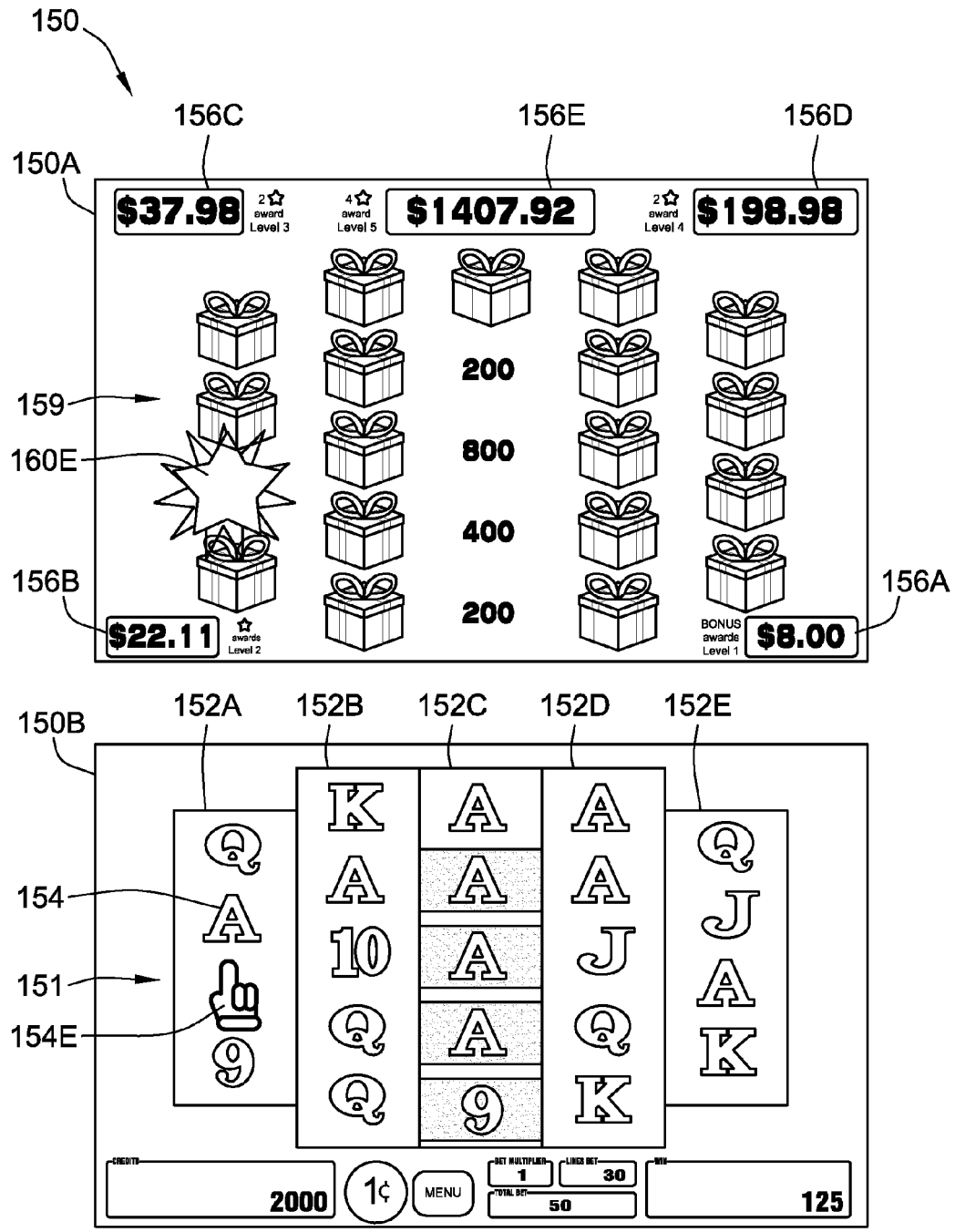
FIG. 9 is an image of an outcome in which a progressive award is revealed.

Referring to FIG. 9, a selected element 160E may reveal a progressive award instead of a credit award. For example, a third one of the free spins has been played and the illustrated randomly selected outcome displays a triggering symbol 154E in the first column, third row, of the first array 151. The counterpart element 160E reveals a star symbol that indicates the winning of the level two progressive awards 156B of $22.1. Optionally, in response to the progressive award 156B being awarded, the number of free spins resets to eight free spins and an entirely new set of selectable elements 160 appears. Optionally yet, when the bonus event ends (e.g., when all the free spins have been played), the contents of each remaining selectable element 160 is revealed to the player.

Figure 10:
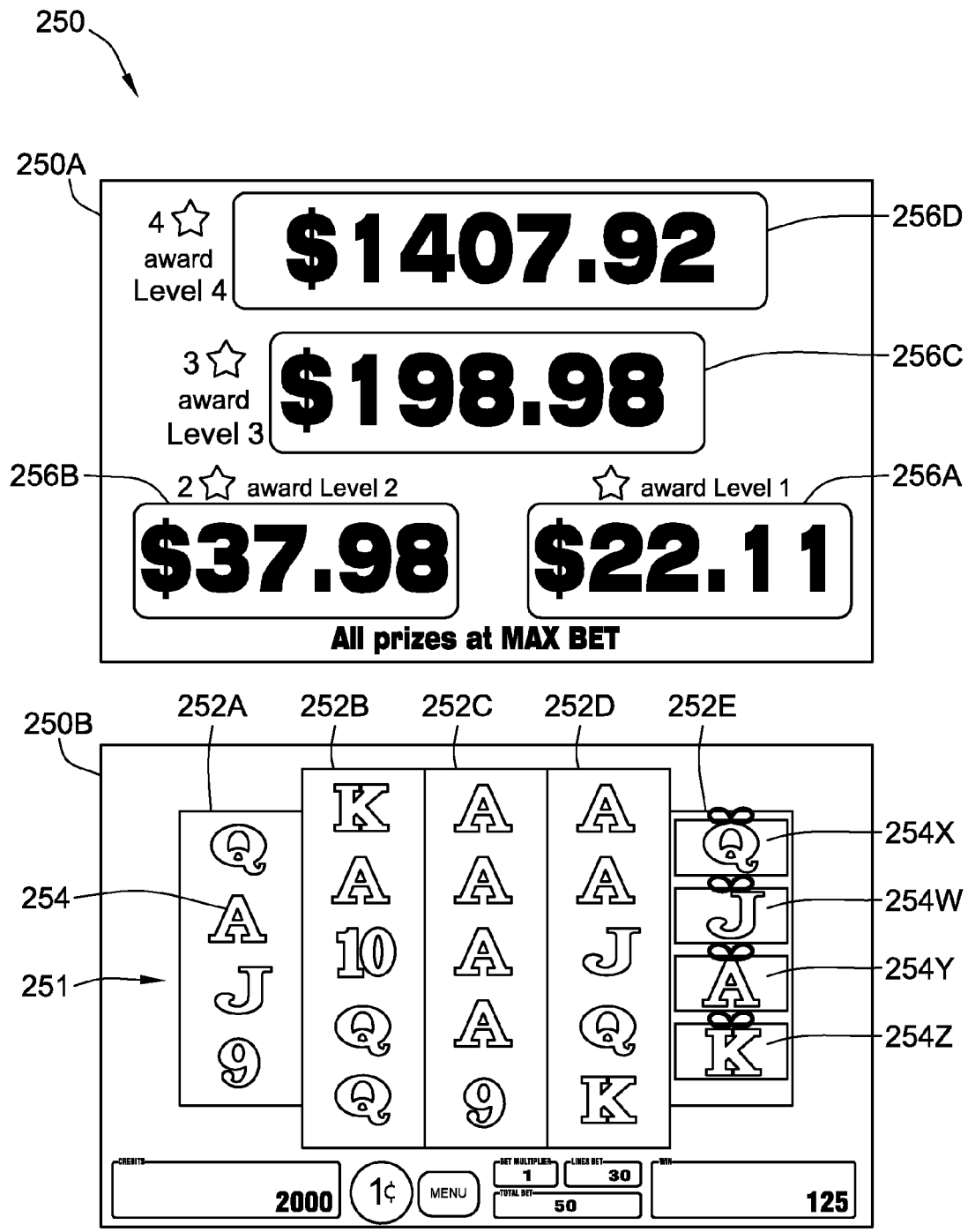
FIG. 10 is an image of another bonus event prior to playing a plurality of free spins, the bonus event including a single array.

Referring to FIG. 10, an image of a game screen 250 is adapted to be displayed on the primary display area 12 or the secondary display area 14. The game screen 250 includes an upper image 250A for displaying progressive award information, including indicia for four different levels of progressive awards 256A-256D. Each of the four levels 256A-256D is awarded based on a respective game outcome.

The game screen 250 further includes a lower image 250B for displaying an array 251 in the form of symbol-bearing reels 252A-252E. The reels 252A-252E have a plurality of symbols 254, including four watermarked symbols 254X-254Z in the rightmost reel 252E. The symbols 254 are displayed in respective positions of the array 251, which has five columns, the first and the fifth columns having four rows and the second, third, and fourth columns having five rows. In response to the random selection of the watermarked symbols 254X-254Z, a bonus event is triggered.

Figure 11:
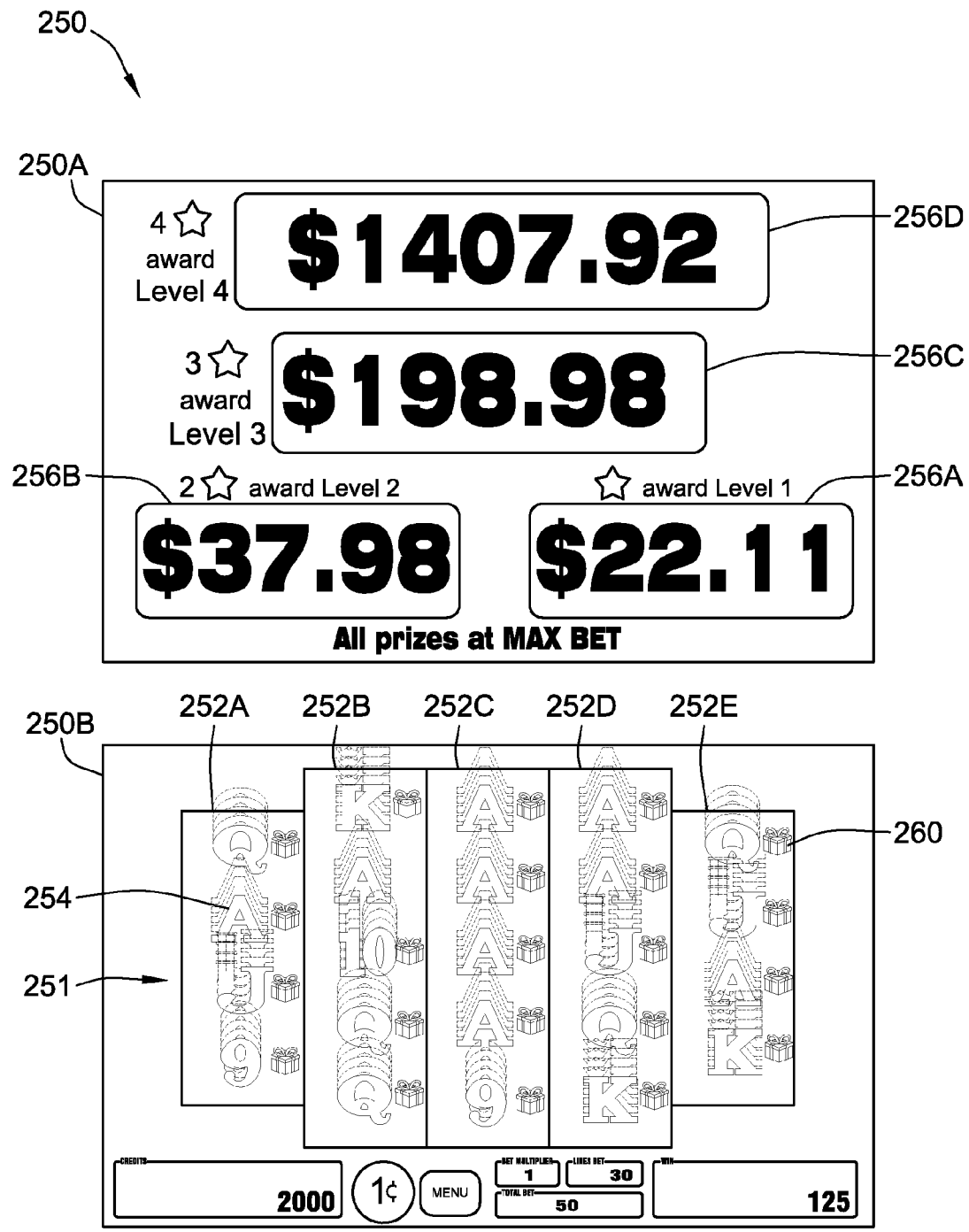
FIG. 11 is an image illustrating a spinning motion of a plurality of reels of the single array.

Referring to FIG. 11, the bonus event has been triggered and awarded to the player. For example, the bonus event includes a plurality of ten free spins, with each randomly selected outcome of the free spins being portrayed in the lower image 250B. A first spin of the awarded free spins is currently shown with the symbols 254 being displayed in a spinning motion.

During the spinning motion, a plurality of selectable elements 260 is displayed in each position of the array 251. For example, the selectable elements 260 may be illustrated as small gift boxes that dangle behind each position of the array 251. The symbols 254 on reels 252A-252E have transparent backgrounds that spin in front of the selectable elements 260. As such, the selectable elements 260 are visible during the spinning motion of the reels 252A-252E.

Figure 12:
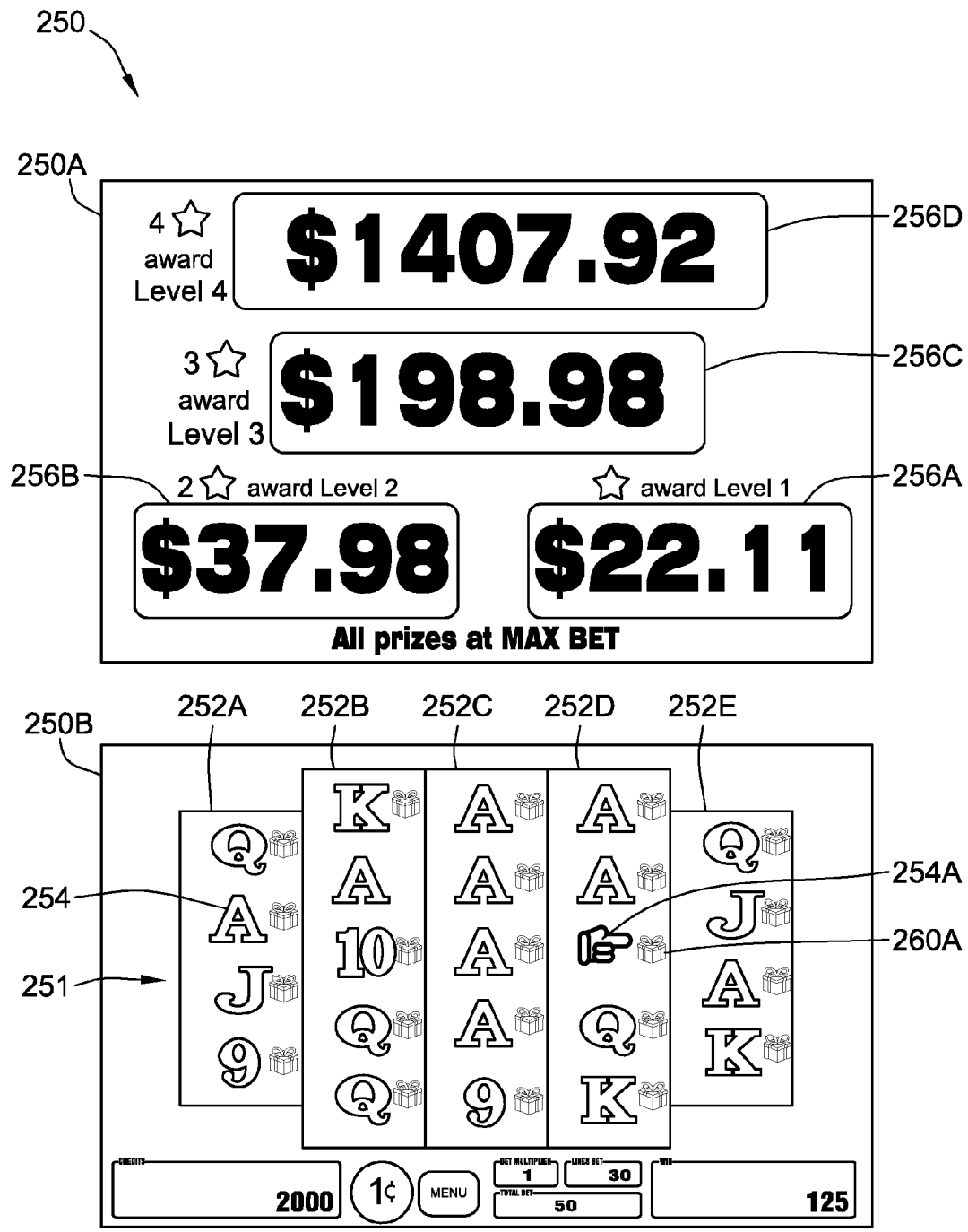
FIG. 12 is an image illustrating an outcome in which a triggering symbol has been achieved.

Referring to FIG. 12, the first spin has been played and the illustrated randomly selected outcome has been achieved in the symbol-bearing reels 252A-252E. One of the symbols in the array 251 is a triggering symbol 254A, illustrated in the form of a hand symbol. The triggering symbol 254A results in selecting, independent of player choice, an associated element 260A in the array 251. Other ones of the symbols 254 pay normally in accordance with a game paytable.

Figure 13:
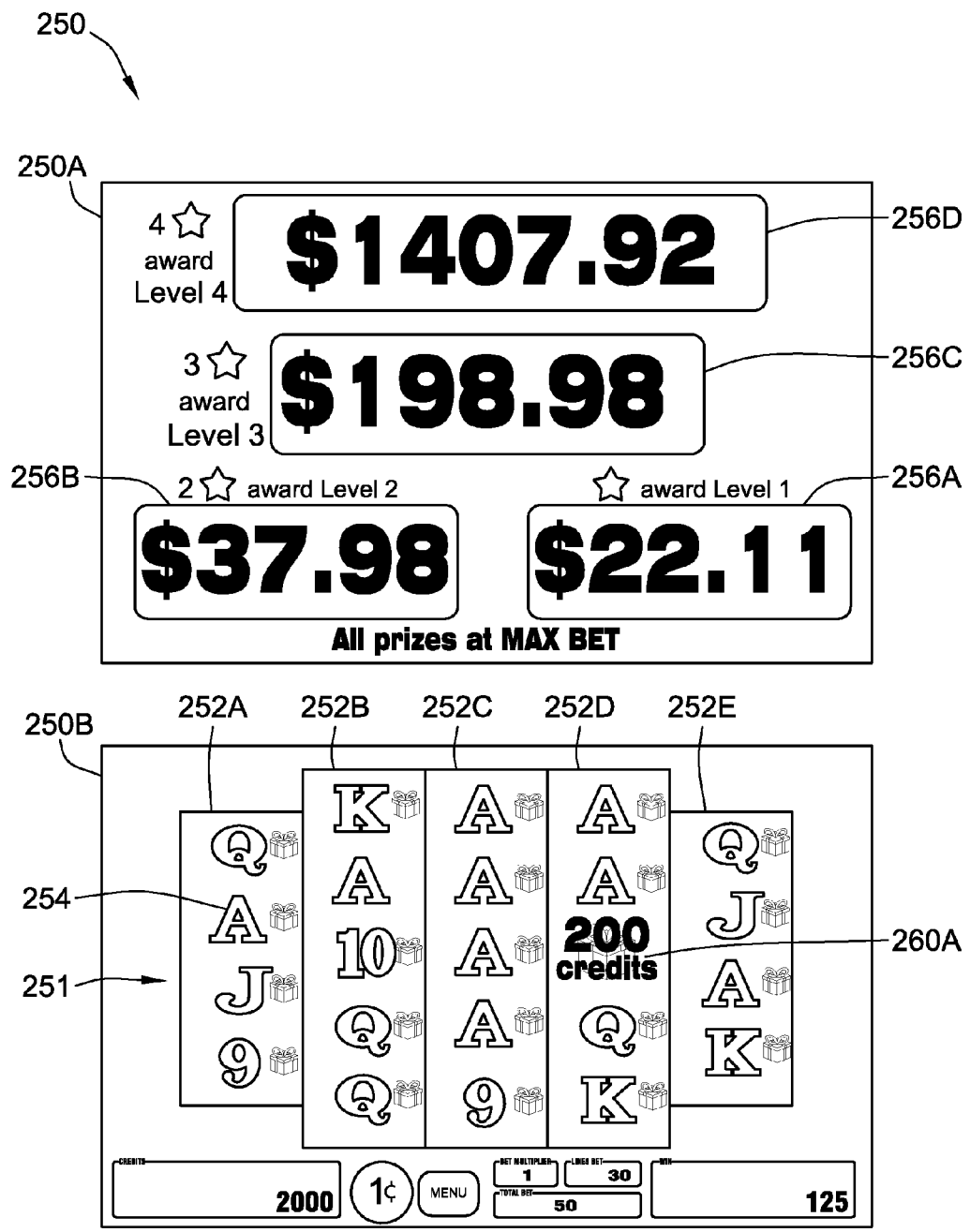
FIG. 13 is an image illustrating an award revealed by an associated selectable element of the triggering symbol of FIG. 12.

Referring to FIG. 13, the selected element 260A reveals a hidden award. Specifically, the gift box increases in size and opens to reveal a credit award of 200 credits. After revealing the credit award, the selected element 260A disappears from the array 251, i.e., the respective position in the array 251 does not have a gift box. Optionally, and similar to the embodiments of FIGS. 8 and 9, the triggering symbol can appear as a clump of triggering symbols, the selectable elements 260 may reveal star symbols associated with progressive awards, and/or the bonus event resets if a progressive award is achieved (e.g., the number of free spins resets back to ten and an entirely new set of gift boxes is presented). Optionally yet, the contents of each remaining gift box is revealed when the bonus event ends.

Figure 14:
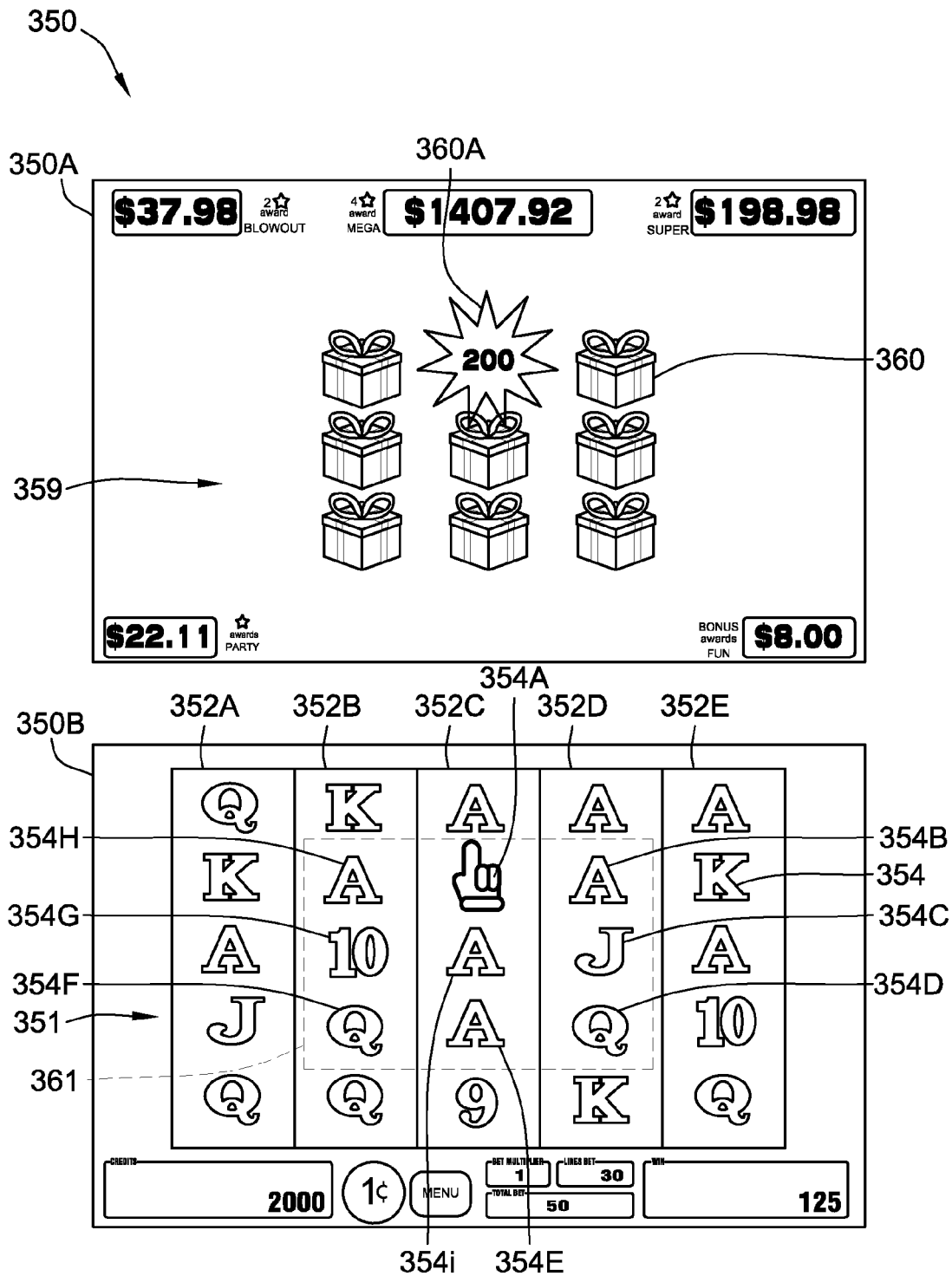
FIG. 14 is an image illustrating two adjacent arrays having different sizes.

Referring to FIG. 14, an image of a game screen 350 is adapted to be displayed on the primary display area 12 or the secondary display area 14. The game screen 350 is similar, but not identical, to the game screen 150 of FIG. 6. For example, the game screen 350 includes an upper image 350A for displaying progressive award information and a second array 359 having a plurality of selectable elements 360 arranged in three rows and three columns. The game screen 350 further includes a lower image 350B for displaying a first array 351 in the form of symbol-bearing reels 352A-352E. The reels 352A-352E have a plurality of symbols 354 arranged in respective positions of the first array 351. Specifically, the first array 351 is arranged in five rows and five columns (i.e., five reels having five positions, each).

One difference between the arrays 351, 359 of the embodiment illustrated in FIG. 14 and the arrays 151, 159 of the embodiment illustrated in FIG. 6 is that the positions of arrays 351, 359 are not mirror-counterparts of each other. For example, the first array 351 has a total of twenty-five positions arranged in a five-by-five configuration, while the second array 359 has a total of nine positions arranged in a three-by-three configuration. Accordingly, a designated subset of positions from the first (larger) array 351 is associated with the positions of the second (smaller) array 359. Specifically, the nine symbols 354A-354I located within the rectangular box 361 are assigned to correspond, respectively, to the nine positions of the second array 359. Alternatively, the size of the first array 351 may be smaller than the size of the second array 359 (e.g., the first array 351 has nine positions and the second array 359 has twenty-five positions).

Only one of the nine symbols 354A-354I may be randomly selected to be a triggering symbol. For example, a triggering symbol 354A has been randomly selected in a second position of a third reel 352C. Accordingly, without any input from the player, an associated element 360A is selected in the second array 359 to reveal a credit award of 200 credits.

Figure 15:
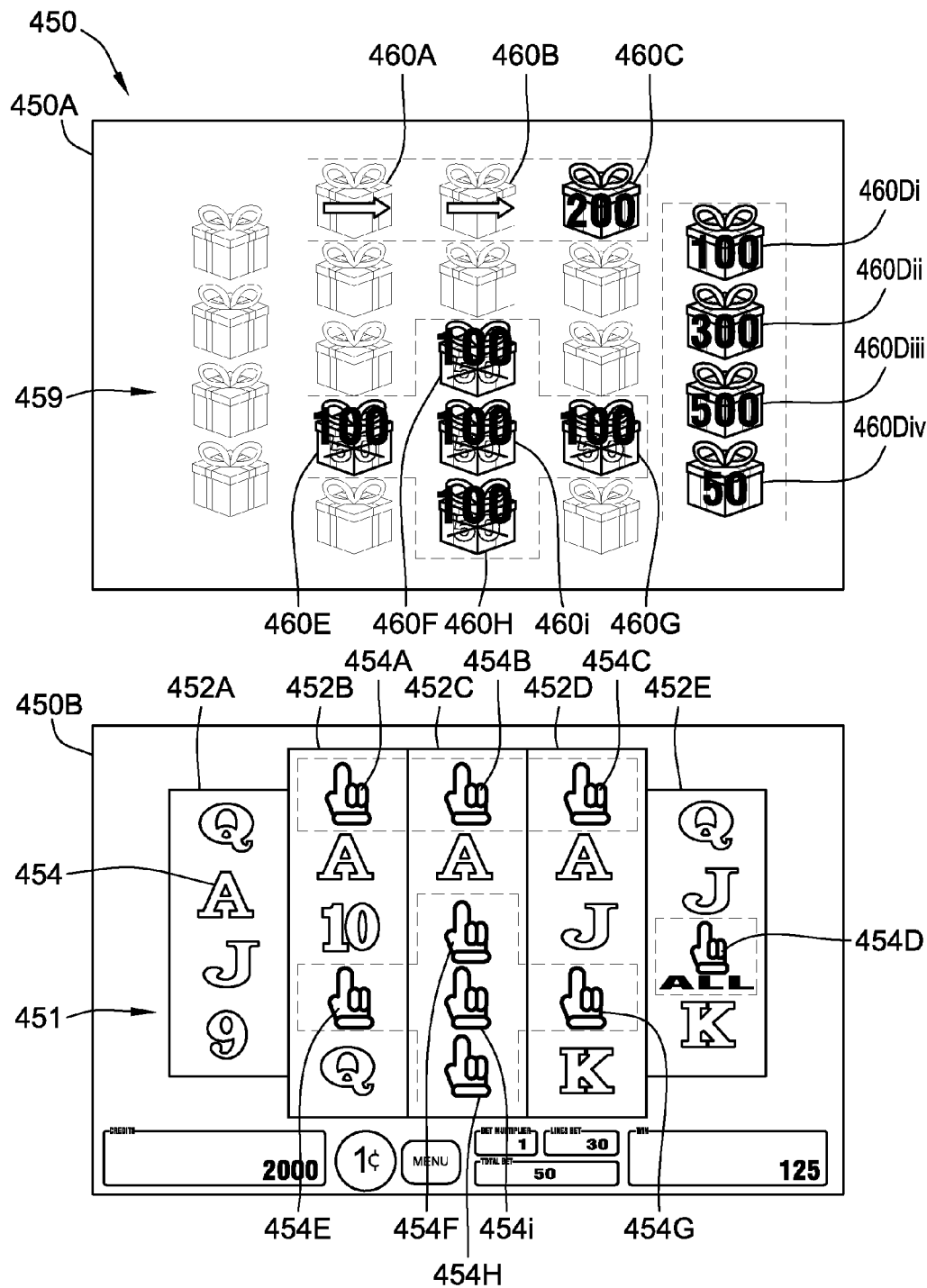
FIG. 15 is an image illustrating outcomes relating to groups of triggering symbols and selectable elements.

Referring to FIG. 15, triggering symbols cause the selection of various combinations of selectable elements. An image of a game screen 450 is adapted to be displayed on the primary display area 12 or the secondary display area 14. The game screen 450 includes an upper image 450A for displaying a second array 459 with selectable elements and a lower image 450B for displaying a first array 451 with symbols 454 arranged on a plurality of reels 452A-452E.

According to one example, a player must complete a group of triggering symbols to receive an award. For example, the player must receive a triggering symbol in each top position of the second, third, and, fourth reels 452B-452D. The triggering symbols can be received in the same free spin or in different spins. Upon receiving a first triggering symbol 454A, a first associated selectable element 460A indicates that a second element 460B is required, e.g., by including an arrow directed towards the next element. Upon receiving a second triggering symbol 454B, the second associated selectable element 460B indicates that a third associated selectable element 460C is required. Upon receiving a third triggering symbol 454C, the player receives a 200 credit award, which is revealed by the third associated selectable element 460C. The triggering symbols 454A-454C may be received during the same spin, e.g., during a first free spin, or during different spins (e.g., the first triggering symbol 454A is received during the first free spin, the second triggering symbol 454B is received during a second free spin, and the third triggering symbol 454C is received during a third free spin).

According to another example, a triggering symbol awards a group of associated selectable elements in a certain row or column. For example, the player must receive a special triggering symbol to receive all the associated selectable elements in a certain column. As illustrated in FIG. 15, a special triggering symbol 454D causes the automatic selection of all elements 460Di-460Div in the fifth column of the second array 459. The selection of the elements 460Di-460Div results in the player receiving the respective revealed awards of 100, 300, 500, and 50 credits.

According to yet another example, an award is greater if a group of selectable elements includes symbols adjacent to each other and/or if the symbols form a specific pattern. For example, five selectable elements 460E-460I are located adjacent to each other having a cross-shaped pattern. Individually, the elements 460E-460I would award 50 credits each. However, achieving all five of the triggering symbols 454E-454I associated, respectively, with the elements 460E-460I, results in an increased award of 100 credits for each of the selectable elements 460E-460I.

Figure 16:
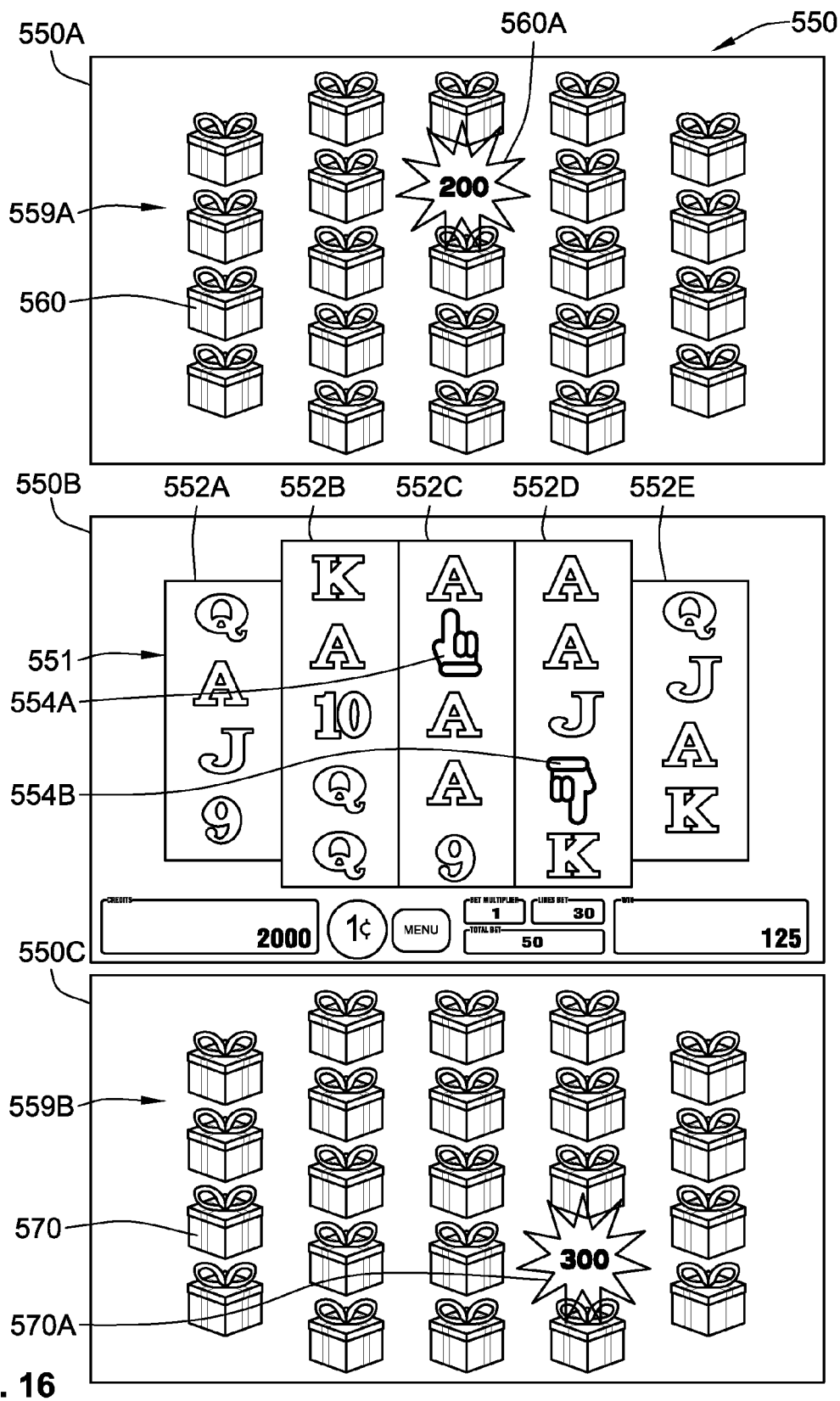
FIG. 16 is an image illustrating three adjacent arrays.

Referring to FIG. 16, an image of a game screen 550 includes multiple arrays 559A, 559B. The game screen 550 includes an upper image 550A, a middle image 550B, and a lower image 550C. The middle image 550B displays a first array 551 having a plurality of reels 552A-552E. The upper image 550A displays a second array 559A with upper selectable elements 560. The lower image 550C displays a third array 559B with lower selectable elements 570. Triggering symbols in the first array 551 determine which array of the second and third arrays 559A, 559B is active.

For example, a first triggering symbol 554A (with a hand pointing upwards towards the second array 559A) activates the second array 559A and an associated upper element 560A reveals an award of 200 credits. In another example, a second triggering symbol 554B (with a hand pointing downwards towards the third array 559B) activates the third array 559B and an associated lower element 570A reveals an award of 300 credits.

Alternatively, the second and third arrays 559A, 559B are activated based on other symbols and/or triggering criteria. For example, an activating symbol, independent of any triggering symbol, on a fifth reel 552E determines which of the two arrays 559A, 559B is active.

Each of these embodiments and obvious variations thereof is contemplated as falling within the spirit and scope of the claimed invention, which is set forth in the following claims.

What is claimed is:

1. A gaming system primarily dedicated to playing at least one casino wagering game, the gaming system comprising:
    a gaming cabinet for housing components associated with the casino wagering game;
    an electronic display device coupled to the gaming cabinet;
    an electronic input device coupled to the gaming cabinet, the electronic input device configured to receive a physical input from a player to initiate the casino wagering game and transform the input into an electronic data signal;
    a random element generator configured to generate one or more random elements; and
    one or more controllers configured to:
        initiate the casino wagering game in response to the electronic data signal from the electronic input device,
        determine an outcome of the casino wagering game based, at least in part, on the one or more random elements,
        direct the electronic display device to display the outcome by spinning and stopping a plurality of symbol-bearing reels to populate an array of reel positions with reel symbols from the stopped reels, each reel position of the array of reel positions further including a respective selectable element,
        in response to a reel position of the array of reel positions including a triggering symbol, select, independent of player choice, the element at the reel position, and award a tangible award based on the selected element.

2. The gaming system of claim 1, wherein the selectable elements are displayed in response to a bonus trigger occurring on the array of reel positions.

3. The gaming system of claim 1, wherein the award is further based on selecting at least one other selectable element from the array of reel position, the at least one other selectable element being associated with the selected element.

4. The gaming system of claim 1, wherein, in addition to the selected element, the award is further based on a displayed pattern of one or more associated selectable elements of the array of reel positions.

5. The gaming system of claim 1, wherein a second array of selectable elements is displayed on the electronic display device with each selectable element of the second array of selectable elements being displayed at respective second positions, each of the second positions being associated with at least one respective first position of the array of reel positions in response to the second array of selectable elements being in an active state.

6. A gaming system, comprising:
    a gaming machine primarily dedicated to playing at least one casino wagering game, the gaming machine including a gaming cabinet, an electronic display device, and an electronic input device, the cabinet constructed to house components associated with the casino wagering game, the electronic display device and the electronic input device being coupled to the gaming cabinet, the electronic input device configured to receive a physical input from a player to initiate the casino wagering game and transform the input into an electronic data signal;
    a random element generator configured to generate one or more random elements; and
    one or more controllers configured to:
        initiate the casino wagering game in response to the electronic data signal from the electronic input device of the gaming machine,
        determine an outcome of the casino wagering game based, at least in part, on the one or more random elements;
        direct the electronic display device to display the outcome by spinning and stopping a plurality of symbol-bearing reels to populate an array of reel positions with reel symbols from the stopped reels, each reel position of the array of reel positions further including a respective selectable element,
        in response to a reel position of the array of reel positions including a triggering symbol, select, independent of player choice, the element at the reel position, and award an award based on the selected element.

7. The gaming system of claim 6, wherein a special award is awarded in response to selecting a group of selectable elements from the array of reel positions, the group of selectable elements being associated with the selected element.

8. The gaming system of claim 6, wherein the award is further based on selecting at least one other selectable element from the array of reel positions, the at least one other selectable element being associated with the selected element.

9. The gaming system of claim 8, wherein the at least one other selectable element and the selected element are associated based on their respective positions in the array of selectable elements.

10. A method of operating a gaming system, the gaming system including a random element generator, one or more controllers, and a gaming machine, the gaming machine primarily dedicated to playing at least one casino wagering game, the gaming machine including a gaming cabinet, an electronic display device, and an electronic input device, the cabinet constructed to house components associated with the casino wagering game, the electronic display device and the electronic input device being coupled to the gaming cabinet, the method comprising:

generating one or more random elements with the random element generator;

receiving, responsive to a physical input to the electronic input device of the gaming machine, a wager input to initiate the casino wagering game;

determining, by the one or more controllers, an outcome of the casino wagering game based, at least in part, on the one or more random elements;

displaying the outcome on the electronic display device of the gaming machine by spinning and stopping a plurality of symbol-bearing reels to populate an array of reel positions with reel symbols from the stopped reels, each reel position of the array of reel positions further including a respective selectable element;

in response to a reel position of the array of reel positions including a triggering symbol, selecting, by the one or more controllers and independent of player choice, the element at the reel position; and awarding, by the one or more controllers, an award based on the selected element.

11. The method of claim 10, further comprising displaying the selectable elements in response to a bonus trigger occurring on the array of reel positions.

12. The method of claim 10, further comprising awarding a special award in response to selecting a group of selectable elements from the array of reel positions, the group of selectable symbols being associated with the selected element.

13. The method of claim 10, wherein, in addition to the selected element, the award is further based on a displayed pattern of one or more associated elements of the selectable elements.

14. The method of claim 10, further comprising:

displaying a second array of reel positions on the electronic display device of the gaming machine; and activating the second array of reel positions to associate each position of the second array of reel positions with a respective position of the array of reel positions.

* * * * *

UNITED STATES PATENT AND TRADEMARK OFFICE
CERTIFICATE OF CORRECTION

PATENT NO. : 9,093,307 B2  
APPLICATION NO. : 13/788764  
DATED : July 28, 2015  
INVENTOR(S) : Dion K. Aoki et al.

Page 1 of 1

It is certified that error appears in the above-identified patent and that said Letters Patent is hereby corrected as shown below:

In the Claims

On Column 12, Line 31 (Claim 5, Line 6), delete "first" after "respective"

Signed and Sealed this  
Fifteenth Day of December, 2015

Michelle K. Lee  
*Director of the United States Patent and Trademark Office*